US011143019B2

(12) United States Patent
Shetty et al.

(10) Patent No.: US 11,143,019 B2
(45) Date of Patent: Oct. 12, 2021

(54) REAL TIME ESTIMATION OF FRACTURE GEOMETRY FROM THE PORO-ELASTIC RESPONSE MEASUREMENTS

(71) Applicant: Halliburton Energy Services, Inc., Houston, TX (US)

(72) Inventors: Dinesh Ananda Shetty, Sugar Land, TX (US); Jie Bai, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 51 days.

(21) Appl. No.: 16/807,431

(22) Filed: Mar. 3, 2020

(65) Prior Publication Data
US 2021/0277769 A1 Sep. 9, 2021

(51) Int. Cl.
| | |
|---|---|
| E21B 47/06 | (2012.01) |
| E21B 49/00 | (2006.01) |
| G01V 99/00 | (2009.01) |
| E21B 41/00 | (2006.01) |
| E21B 43/26 | (2006.01) |
| G06F 30/10 | (2020.01) |

(52) U.S. Cl.
CPC .......... *E21B 47/06* (2013.01); *E21B 41/0092* (2013.01); *E21B 49/00* (2013.01); *G01V 99/005* (2013.01); *G06F 30/10* (2020.01); *E21B 43/26* (2013.01)

(58) Field of Classification Search
None
See application file for complete search history.

(56) References Cited

U.S. PATENT DOCUMENTS

| | | |
|---|---|---|
| 9,988,895 B2 | 6/2018 | Roussel et al. |
| 2009/0043554 A1* | 2/2009 | Horne ............... G01V 3/083 703/10 |
| 2010/0310141 A1 | 12/2010 | Wilson |
| 2011/0082676 A1 | 4/2011 | Bratvedt et al. |
| 2011/0125471 A1 | 5/2011 | Craig et al. |
| | (Continued) | |

OTHER PUBLICATIONS

Wang, H. Poro-elasto-plastic modeling of complex hydraulic fracture propagation: simultaneous multi-fracturing and producing well interference. Acta Mech 227, 507-525 (2016). (Year: 2016).*

(Continued)

*Primary Examiner* — Roy Y Yi
(74) *Attorney, Agent, or Firm* — John Wustenberg; C. Turney Law Group PLLC

(57) ABSTRACT

A method and system for modeling a fracture geometry. The method may comprise taking one or more pressure measurements from an offset wellbore, identifying a pressure trend of the offset wellbore, and comparing the one or more pressure measurements to the pressure trend to identify a poro-elastic trend. The method may further comprise creating a poro-elastic model of a target wellbore from the poro-elastic trend, identifying the fracture geometry of a fracture in the target wellbore from at least the poro-elastic trend, and comparing the fracture geometry to a target fracture geometry. The system may comprise a pressure measurement device disposed in an offset wellbore, one or more pieces of equipment configured for a fracture operation and connected to a target wellbore, and an information handling system.

20 Claims, 4 Drawing Sheets

(56) References Cited

U.S. PATENT DOCUMENTS

| | | |
|---|---|---|
| 2013/0124162 A1 | 5/2013 | Hu et al. |
| 2013/0231910 A1 | 9/2013 | Kumar et al. |
| 2014/0185902 A1 | 7/2014 | Wilson |
| 2014/0372060 A1 | 12/2014 | Xuan et al. |
| 2016/0123119 A1 | 5/2016 | Tueckmantel et al. |
| 2017/0002652 A1 | 1/2017 | Kampfer et al. |
| 2017/0052283 A1 | 2/2017 | Hoeink et al. |
| 2017/0114613 A1* | 4/2017 | Lecerf .................. E21B 41/0092 |
| 2017/0247998 A1 | 8/2017 | Shetty et al. |
| 2017/0268321 A1 | 9/2017 | Madasu et al. |
| 2017/0298713 A1 | 10/2017 | Shetty et al. |
| 2017/0306737 A1 | 10/2017 | Shetty et al. |
| 2017/0343689 A1 | 11/2017 | Dykstra et al. |
| 2018/0217285 A1 | 8/2018 | Walters et al. |
| 2018/0275301 A1 | 9/2018 | Ma et al. |
| 2018/0306015 A1 | 10/2018 | Shetty et al. |
| 2018/0371874 A1 | 12/2018 | Shetty et al. |
| 2019/0078424 A1 | 3/2019 | Copeland et al. |
| 2019/0353825 A1 | 11/2019 | Tene et al. |

OTHER PUBLICATIONS

Carey, M. A., Mondal, S., & Sharma, M. M. (2015). Analysis of Water Hammer Signatures for Fracture Diagnostics. SPE Annual Technical Conference and Exhibition.

ARMA 16-843, Kampfer, et al., A Novel Approach to Mapping Hydraulic Fractures using Poromechanica Principles, 2016.

URTeC: 449, Elliott, et al., Interpreting Inter-Well Poroelastic Pressure Transient Data: An Analytical Approach Validated with Field Case Studies, 2019.

URTeC-2886118, Spicer, et al., Estimation of Fracture Geometries from Poroelastic Pressure Responses in Offset Wells, 2018.

\* cited by examiner

REAL TIME ESTIMATION OF FRACTURE GEOMETRY FROM THE PORO-ELASTIC RESPONSE MEASUREMENTS

BACKGROUND

Wellbores drilled into subterranean formations may enable recovery of desirable fluids (e.g., hydrocarbons) using a number of different techniques. Stimulation of the wellbore may be a technique utilized to enable and/or improve recovery of desirable fluids. During stimulation treatment, fluids may be pumped under high pressure into a rock formation through a wellbore to fracture the formation and increase permeability, which may enhance hydrocarbon production from the formation.

Currently, operators may not know in real time fracture geometry of fractures created during fracturing operations. Knowing fracture geometry, such as length, width, and/or height may be vital to planning and performing additional treatments during the fracture operation. Many existing methods and systems for determining fracture geometry are performed after fracture operations or are inaccurate and inconsistent. Additionally, fracture geometry may be determine based on the experience of personnel running the fracture operation, which may lead to human error.

BRIEF DESCRIPTION OF THE DRAWINGS

These drawings illustrate certain aspects of some examples of the present disclosure and should not be used to limit or define the disclosure.

DETAILED DESCRIPTION OF THE PREFERRED EMBODIMENTS

The present disclosure describes methods and systems for estimating fracture geometry of a target wellbore based at least in part on poro-elastic responses determined from one or more offset wellbores. Specifically, poro-elastic responses may be found from pressure measurements taken at offset wellbore. Additionally, poro-elastic responses may be found with knowledge obtained from the creation of the offset wellbore and databases that store this information. The databases may include characteristics of the formation in which the one or more offset wellbores and target wellbore may be disposed. These characteristics may be used to estimate fracture geometry for a target wellbore. Currently, there are many system and methods that try to determine fracture geometry during fracturing operations. Fracture geometry is defined as one or more dimensions of a fracture created during fracture operations. Dimensions may include length, height, width, radius, and/or the like of the fracture. However, current methods and system can be inaccurate, untrustworthy, and are performed after a fracture operation.

The methods and system disclosed below may utilize one or more offset wellbores to more accurately determine fracture geometry of a target wellbore in real time during a fracture operation. As defined in this disclosure, an offset wellbore is an existing wellbore within a formation, or the same formation of the target wellbore, that has similar characteristics of the formation in which the target wellbore is disposed. As discussed below, fracture geometry of the target wellbore may be found based on pressure measurements taken within an offset wellbore during the fracture operation in the target wellbore. In examples, the offset wellbore may be idle, or undergoing downhole operations. These measurements from one or more offset wellbores may be used to visualize and control fracture geometry within a target wellbore during fracture operations. This can provide real time monitoring and control of fracture geometry based at least in part on pressure measurements from the offset wellbore.

Figure 1:
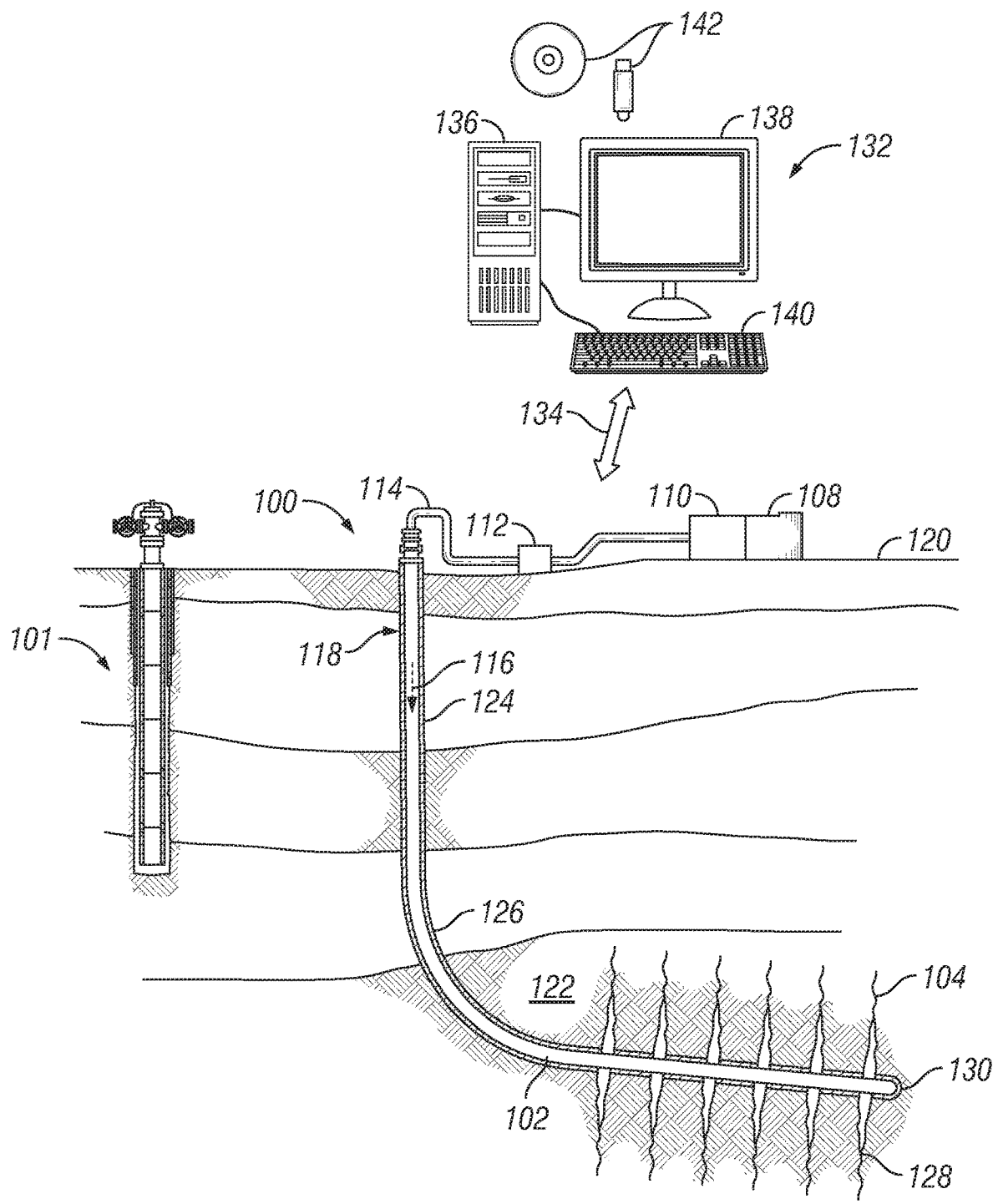
FIG. 1 illustrates a schematic view of an example well system utilized for hydraulic fracturing.

FIG. 1 illustrates an example of a well system 100 that includes a target wellbore 102. Additionally, an offset wellbore 101, is also disposed within formation 122. In examples, offset wellbore 101 may be disposed adjacent to, close to, or far away from target wellbore 102. The distance form offset wellbore 101 and target wellbore 102 is not of concern. However, offset wellbore 101 and target wellbore 102 should be disposed in a similar formation 122. This may allow for offset wellbore 101 to be disposed many miles away from target wellbore 102, so as each offset wellbore 101 and target wellbore 102 are disposed in a similar formation 122. Although offset wellbore 101 is illustrated as a vertical wellbore, offset wellbore 101 may include horizontal sections, similar to target wellbore 102.

As illustrated target wellbore 102 may be undergoing fracture operations in which fractures 104 are created within formation 122. By way of example, well system 100 may be simulated by a simulator, modeling, and/or the like to determine fracture geometry. Well system 100 may include a fluid handling system 106, which may include fluid supply 108, mixing equipment 110, pumping equipment 112, and wellbore supply conduit 114. Pumping equipment 112 may be fluidly coupled with fluid supply 108 and wellbore supply conduit 114 to communicate a fracturing fluid 116 into wellbore 118. Fluid supply 108 and pumping equipment 112 may be above the surface 120 while wellbore 118 is below surface 120.

Well system 100 may also be used for the injection of a pad or pre-pad fluid into the subterranean formation 122 at an injection pressure at or above the fracture gradient to create at least one fracture 104 in subterranean formation 122. Well system 100 may then inject fracturing fluid 116 into subterranean formation 122 surrounding wellbore 118. Generally, wellbore 118 may include horizontal, vertical, slanted, curved, and other types of wellbore geometries and orientations. Wellbore 118 may include casing 124 that may be cemented (or otherwise secured) to the wall of wellbore 118 by cement sheath 126. Perforations 128 may allow communication between wellbore 118 and subterranean formation 122. As illustrated, perforations 128 may penetrate casing 124 and cement sheath 126 allowing communication between interior of casing 124 and fractures 104. A plug 130, which may be any type of plug for oilfield applications (e.g., bridge plug), may be disposed in wellbore 118 below perforations 128.

In accordance with systems and/or methods of the present disclosure, a perforated interval of interest (depth interval of wellbore 118 including perforations 128) may be isolated with plug 130. A pad or pre-pad fluid may be injected into the subterranean formation 122 at an injection rate at or above the fracture gradient to create at least one fracture 104 in subterranean formation 122. A fracturing fluid 116 may then be pumped via pumping equipment 112 from fluid supply 108 down the interior of casing 124 and into subterranean formation 122 at or above a fracture gradient of the subterranean formation 122. Pumping fracturing fluid 116 at or above the fracture gradient of subsurface formation 122 may create (or enhance) at least one fracture (e.g., fractures 104) extending from perforations 128 into subterranean formation 122. Alternatively, fracturing fluid 116 may be pumped down production tubing, coiled tubing, or a combination of coiled tubing and annulus between the coiled tubing and casing 124. At least a portion of fracturing fluid 116 may enter fractures 104 of subterranean formation 122 surrounding wellbore 118 by way of perforations 128. Perforations 127 may extend from the interior of casing 124, through cement sheath 126, and into subterranean formation 122. During fracture operations, stages or zones along the perforated interval of interest are fractured sequentially from toe to heel of wellbore 118. Controlling fracture operations through one or more stages or zones may be controlled, at least in part, by an information handling system 132. Stages may be divided equally along the performed interval of interest, or set up in any specific matter for the fracture operations. Thus, each stage may have the same length, or each zone may have different lengths. Stage length may be determined based on the formation and how the formation should be fractured.

As illustrated in FIG. 1, well system 100 may be connected to and/or controlled by information handling system 132, which may be disposed on surface 120. Without limitation, information handling system 132 may be disposed on downhole tools (not illustrated) within wellbore 118 during operations. Processing of information recorded may occur down hole and/or on surface 120. Processing occurring downhole may be transmitted to surface 120 to be recorded, observed, and/or further analyzed. Additionally, information recorded on information handling system 132 that may be disposed down hole may be stored until the downhole tool may be brought to surface 120. In examples, information handling system 132 may communicate with fluid handling system 106 through a communication link 134.

Communication link 134 may be wired or wireless and traverse across a network. Information handling system 132 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 132 may be a personal computer, a network storage device, or any other suitable device and may vary in size, shape, performance, functionality, and price. In examples, information handling system 132 may be a standalone or integrated device such as a smart phone, tablet, PC, server, set top box, receiver, digital video recorder, streaming video player, console, and the like. Information handling system 132 may also include display devices such as a monitor featuring an operating system, media browser, and the ability to run one or more software applications.

In examples, information handling system 132 is attached to a database, not illustrated. The database may include one or more databases and information sources. Information handling system 132 may transmit information to or from the database for distribution over communication link 134 and/or other network connected devices (not shown). In an example, information handling system 132 may process and provide information from the database for wellbore information including depths, type, wellbore configuration, sand concentrations, subterranean conditions, pressure measurements, fracture geometries, and hydraulic fluid composition attributes. Information handling system 132 may include a graphics library associated with providing design information associated with layout, fonts, colors, and the like that are associated with an information interface. Information handling system 132 may comprise a computing device as described herein. Consistent with embodiments of the disclosure, information handling system 132 may comprise one or more software applications (i.e., a series of instructions configured for execution by a processing unit) associated with another component, such as one or more servers or dedicated content devices.

As discussed above, communication link 134 may be a network (also referred herein as distribution network or communication network) which, generally, is used and implemented by a service provider (such as, but not limited to, a wired and/or wireless communication service provider). The network additionally refers to infrastructure, including apparatuses and methods, operative and utilized to communicate data and/or signals between information handling system 132 and other networked devices. Similarly, for example and not limitation, the network may include current and future wired and/or wireless communication infrastructure for communicating data and/or signals with other communication networks, such as the internet. The network may take one or more forms, or a combination thereof. Additionally, the network may also allow for real-time, off-line, and/or batch transactions to be transmitted between or among information handling system 132 and one or more networked devices, such as a database. Due to network connectivity, various methodologies as described herein may be practiced in the context of distributed computing environments.

In examples, it is to be understood that other network configurations may be used. For example, intervening networks may include a plurality of networks, each with devices such as gateways and routers for providing connectivity between or among networks. Instead of, or in addition to the network, dedicated communication links may be used to connect the various devices in accordance with example embodiments of the disclosure.

As illustrated in FIG. 1, wireless communication may be used to transmit information back and forth between information handling system 132 and fluid handling system 106. Information handling system 132 may transmit information to fluid handling system 106 and may receive as well as process information recorded by fluid handling system 106. In examples, a downhole information handling system (not illustrated) may include, without limitation, a microprocessor or other suitable circuitry, for estimating, receiving and processing signals from the downhole tool. Downhole information handling system (not illustrated) may further include additional components, such as memory, input/output devices, interfaces, and the like. In examples, while not illustrated, downhole tool may include one or more additional components, such as analog-to-digital converter, filter and amplifier, among others, that may be used to process the measurements of the downhole tool before they may be transmitted to surface 120. Alternatively, raw measurements from the downhole tool may be transmitted to surface 120.

Any suitable technique may be used for transmitting signals from the downhole tool to surface 120, including, but not limited to, wired pipe telemetry, mud-pulse telemetry, acoustic telemetry, and electromagnetic telemetry. While not illustrated, the downhole tool may include a telemetry subassembly that may transmit telemetry data to surface 120. At surface 120, pressure transducers (not shown) may convert the pressure signal into electrical signals for a digitizer (not illustrated). The digitizer may supply a digital form of the telemetry signals to information handling system 132 via a communication link 134, which may be a wired or wireless link. The telemetry data may be analyzed and processed by information handling system 132.

As illustrated, communication link 134 (which may be wired, wireless, or over a network, for example) may be provided that may transmit data from the downhole tool to an information handling system 132 at surface 120. Information handling system 132 may include a personal computer 136, a video display 138, a keyboard 140 (i.e., other input devices.), and/or non-transitory computer-readable media 142 (e.g., optical disks, magnetic disks) that may store code representative of the methods described herein. In addition to, or in place of processing at surface 120, processing may occur downhole.

In examples, information handling system 132 (or a different information system) may simulate fracture geometry during fracture operations from pressure measurements taken in offset wellbores 101, further discussed below. Additionally, information handling system 132 may be disposed at well site or remote from a well site. Information handling system 132 may simulate well system 100, fracture operations, fracture geometries, and/or the like.

Figure 2A:
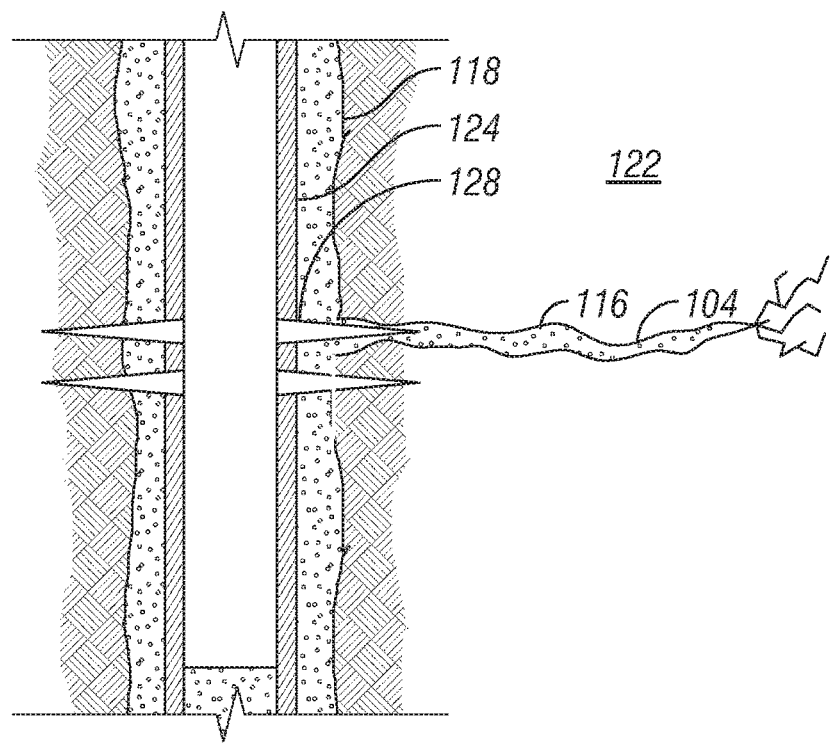
FIG. 2A illustrates a view of a fracture connected to a wellbore.

FIG. 2A illustrates an isometric view of fracture 104. During fracturing operations, fracturing fluid 116, as discussed above, may be utilized to form fracture 104. Fracturing fluid 116 may cause one or more fractures to be created or extended in a subterranean formation 122. As illustrated fracture 104 is shown extending from wellbore 118. Fracturing of subterranean formation 122 may be accomplished using any suitable technique. By way of example, a fracturing treatment may include introducing a fracturing fluid into subterranean formation 122 at or above a fracturing pressure. Fracturing fluid 116 may be introduced by pumping fracturing fluid 116 through casing 124, perforations 128, and into subterranean formation 122 surrounding wellbore 118. Alternatively, a jetting tool (not shown) may be used to initiate fracture 104.

Figure 2B:
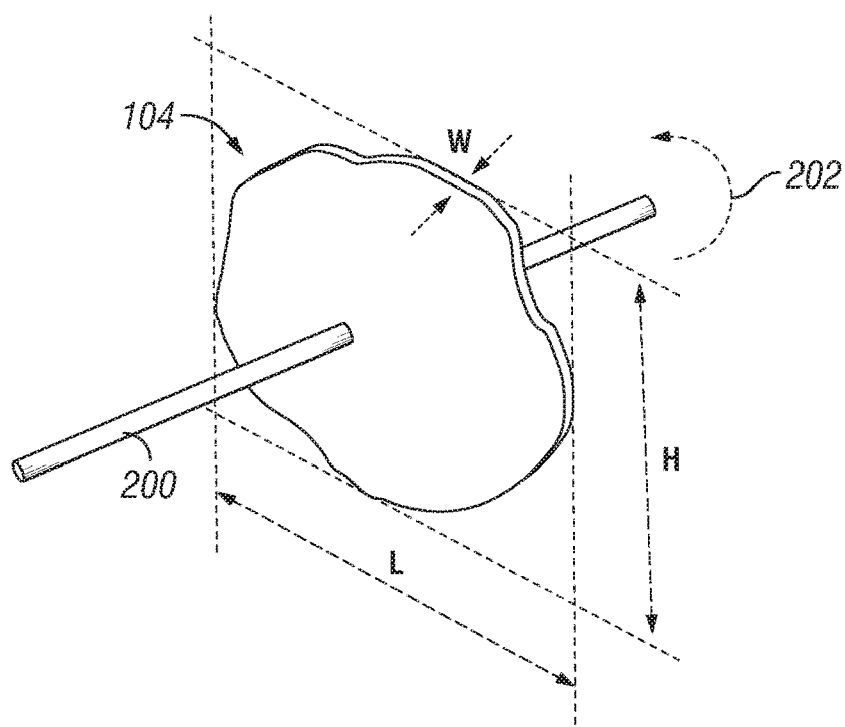
FIG. 2B is a cross section of the fracture.

As discussed in further detail below, the fracture geometry of fracture 104 is beneficial to understand and manipulate through operational control in real time. Fracture geometry may include, length, height, width, radius, orientation, and/or the like of fracture 104. FIG. 2B illustrates a cross section view of fracture 104 along a longitudinal axis 200. As illustrated in FIG. 2B, length is identified by "L," width is identified as "W," height is identified as "H," and orientation is identified as arrow 202. These are four of the main fracture geometries that will be solved for with methods described below. Understanding fracture geometry may be beneficial to fracture operations because it allows for a real time analysis of fractures 104 and if the fractures 104 produced are conforming to design goals. For example, to avoid well interference or to achieve certain growth rates. Controlling well interference is defined as controlling fracture length and height such that it does not connect to another wellbore or the fracture network associated with nearby wellbores. Growth rates are defined as maximizing complexity, achieving certain uniformity of clusters, or targeting certain pumping flowrate to fracture growth rate ratio. Another additional benefit of knowing fracture geometry is to use the measured fracture geometry to tune a fracture simulator in real time, and use it to predict future with more accuracy. This may allow the simulator to be used to perform control over the fracture operation. Identifying fracture geometry allows personnel to manipulate the geometry, which may increase fluid production.

Identifying fracture geometries in real time of a target wellbore 102 (e.g., referring to FIG. 1) may be performed by modeling and comparisons to offset wellbores 101 (e.g., referring to FIG. 1). As discussed above, the software, algorithms, and modeling is performed by information handling system 132. Information handling system 132 may perform steps, run software, perform calculations, and/or the like automatically, through automation (such as through artificial intelligence ("AI"), dynamically, in real-time, and/or substantially in real-time.

Figure 3:
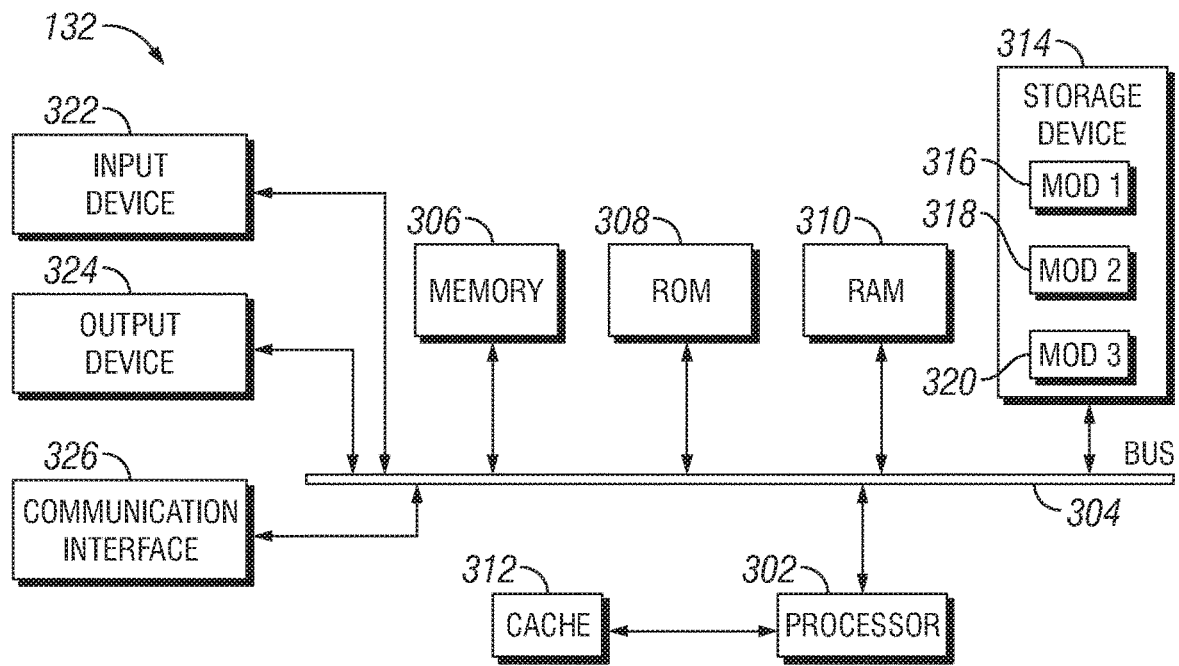
FIG. 3 is a schematic view of an information handling system.

FIG. 3 illustrates an example information handling system 132 which may be employed to perform various steps, methods, and techniques disclosed herein. Persons of ordinary skill in the art will readily appreciate that other system examples are possible. As illustrated, information handling system 132 includes a processing unit (CPU or processor) 302 and a system bus 304 that couples various system components including system memory 306 such as read only memory (ROM) 308 and random access memory (RAM) 310 to processor 302. Processors disclosed herein may all be forms of this processor 302. Information handling system 132 may include a cache 312 of high-speed memory connected directly with, in close proximity to, or integrated as part of processor 302. Information handling system 132 copies data from memory 306 and/or storage device 314 to cache 312 for quick access by processor 302. In this way, cache 312 provides a performance boost that avoids processor 302 delays while waiting for data. These and other modules may control or be configured to control processor 302 to perform various operations or actions. Other system memory 306 may be available for use as well. Memory 306 may include multiple different types of memory with different performance characteristics. It may be appreciated that the disclosure may operate on information handling system 132 with more than one processor 302 or on a group or cluster of computing devices networked together to provide greater processing capability. Processor 302 may include any general purpose processor and a hardware module or software module, such as first module 316, second module 318, and third module 320 stored in storage device 314, configured to control processor 302 as wed as a special-purpose processor where software instructions are incorporated into processor 302. Processor 302 may be a self-contained computing system, containing multiple cores or processors, a bus, memory controller, cache, etc. A multi-core processor may be symmetric or asymmetric. Processor 302 may include multiple processors, such as a system having multiple, physically separate processors in different sockets, or a system having multiple processor cores on a single physical chip. Similarly, processor 302 may include multiple distributed processors located in multiple separate computing devices, but working together such as via a communications network. Multiple processors or processor cores may share resources such as memory 306 or cache 312, or may operate using independent resources. Processor 302 may include one or more state machines, an application specific integrated circuit (ASIC), or a programmable gate array (PGA) including a field PGA (FPGA).

Each individual component discussed above may be coupled to system bus 304, which may connect each and every individual component to each other. System bus 304 may be any of several types of bus structures including a memory bus or memory controller, a peripheral bus, and a local bus using any of a variety of bus architectures. A basic input/output (BIOS) stored in ROM 308 or the like, may provide the basic routine that helps to transfer information between elements within information handling system 132, such as during start-up. Information handling system 132 further includes storage devices 314 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. Storage device 314 may include software modules 316, 318, and 320 for controlling processor 302. Information handling system 132 may include other hardware or software modules. Storage device 314 is connected to the system bus 304 by a drive interface. The drives and the associated computer-readable storage devices provide nonvolatile storage of computer-readable instructions, data structures, program modules and other data for information handling system 132. In one aspect, a hardware module that performs a particular function includes the software component stored in a tangible computer-readable storage device in connection with the necessary hardware components, such as processor 302, system bus 304, and so forth, to carry out a particular function. In another aspect, the system may use a processor and computer-readable storage device to store instructions which, when executed by the processor, cause the processor to perform operations, a method or other specific actions. The basic components and appropriate variations may be modified depending on the type of device, such as whether information handling system 132 is a small, handheld computing device, a desktop computer, or a computer server. When processor 302 executes instructions to perform "operations", processor 302 may perform the operations directly and/or facilitate, direct, or cooperate with another device or component to perform the operations.

As illustrated, information handling system 132 employs storage device 314, which may be a hard disk or other types of computer-readable storage devices which may store data that are accessible by a computer, such as magnetic cassettes, flash memory cards, digital versatile disks (DVDs), cartridges, random access memories (RAMs) 310, read only memory (ROM) 308, a cable containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with information handling system 132, an input device 322 represents any number of input mechanisms, such as a microphone for speech, a touch-sensitive screen for gesture or graphical input, keyboard, mouse, motion input, speech and so forth. An output device 324 may also be one or more of a number of output mechanisms known to those of skill in the art. In some instances, multimodal systems enable a user to provide multiple types of input to communicate with information handling system 132. Communications interface 326 generally governs and manages the user input and system output. There is no restriction on operating on any particular hardware arrangement and therefore the basic hardware depicted may easily be substituted for improved hardware or firmware arrangements as they are developed.

As illustrated, each individual component describe above is depicted and disclosed as individual functional blocks. The functions these blocks represent may be provided through the use of either shared or dedicated hardware, including, but not limited to, hardware capable of executing software and hardware, such as a processor 302, that is purpose-built to operate as an equivalent to software executing on a general purpose processor. For example, the functions of one or more processors presented in FIG. 3 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 308 for storing software performing the operations described below, and random access memory (RAM) 310 for storing results. Very large scale integration (VLSI) hardware embodiments, as well as custom VLSI circuitry in combination with a general purpose DSP circuit, may also be provided.

The logical operations of the various methods, described below, are implemented as: (1) a sequence of computer implemented steps, operations, or procedures running on a programmable circuit within a general use computer, (2) a sequence of computer implemented steps, operations, or procedures running on a specific-use programmable circuit and/or (3) interconnected machine modules or program engines within the programmable circuits. Information handling system 132 may practice all or part of the recited methods, may be a part of the recited systems, and/or may operate according to instructions in the recited tangible computer-readable storage devices. Such logical operations may be implemented as modules configured to control processor 302 to perform particular functions according to the programming of software modules 316, 318, and 320.

Figure 4:
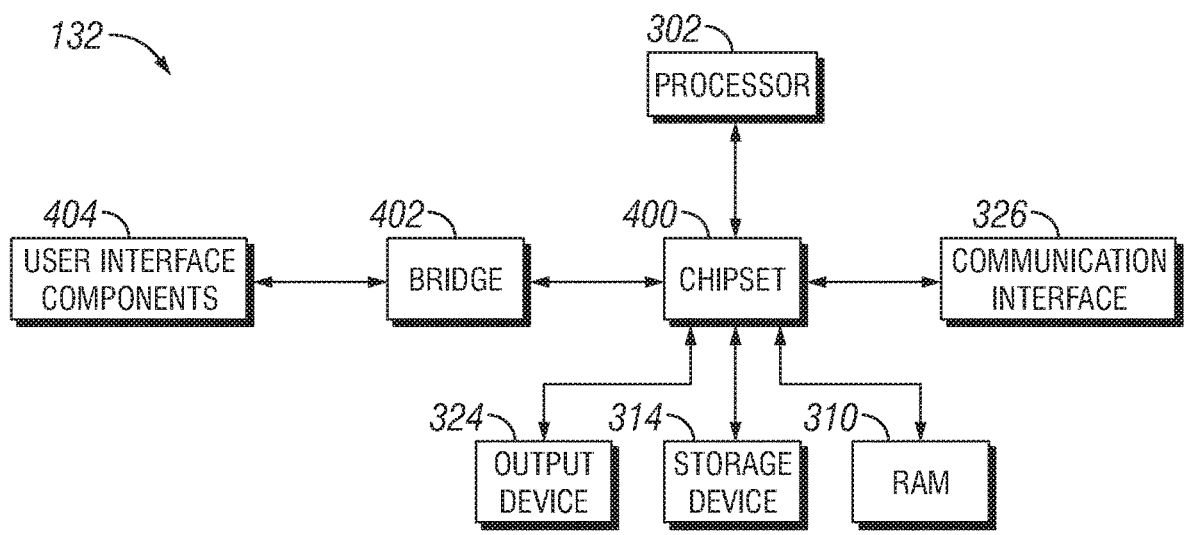
FIG. 4 is another schematic view of the information handling system.

In examples, one or more parts of the example information handling system 132, up to and including the entire information handling system 132, may be virtualized. For example, a virtual processor may be a software object that executes according to a particular instruction set, even when a physical processor of the same type as the virtual processor is unavailable. A virtualization layer or a virtual "host" may enable virtualized components of one or more different computing devices or device types by translating virtualized operations to actual operations. Ultimately however, virtualized hardware of every type is implemented or executed by some underlying physical hardware. Thus, a virtualization compute layer may operate on top of a physical compute layer. The virtualization compute layer may include one or more virtual machines, an overlay network, a hypervisor, virtual switching, and any other virtualization application FIG. 4 illustrates an example information handling system 132 having a chipset architecture that may be used in executing the described method and generating and displaying a graphical user interface (GUI). Information handling system 132 is an example of computer hardware, software, and firmware that may be used to implement the disclosed technology. Information handling system 132 may include a processor 302, representative of any number of physically and/or logically distinct resources capable of executing software, firmware, and hardware configured to perform identified computations. Processor 302 may communicate with a chipset 400 that may control input to and output from processor 302. In this example, chipset 400 outputs information to output device 324, such as a display, and may read and write information to storage device 314, which may include, for example, magnetic media, and solid state media. Chipset 400 may also read data from and write data to RAM 310. A bridge 402 for interfacing with a variety of user interface components 404 may be provided for interfacing with chipset 400. Such user interface components 404 may include a keyboard, a microphone, touch detection and processing circuitry, a pointing device, such as a mouse, and so on. In general, inputs to information handling system 132 may come from any of a variety of sources, machine generated and/or human generated.

Chipset 400 may also interface with one or more communication interfaces 326 that may have different physical interfaces. Such communication interfaces may include interfaces for wired and wireless local area networks, for broadband wireless networks, as well as personal area networks. Some applications of the methods for generating, displaying, and using the GUI disclosed herein may include receiving ordered datasets over the physical interface or be generated by the machine itself by processor 302 analyzing data stored in storage device 314 or RAM 310. Further, information handling system 132 receive inputs from a user via user interface components 404 and execute appropriate functions, such as browsing functions by interpreting these inputs using processor 302.

In examples, information handling system 132 may also include tangible and/or non-transitory computer-readable storage devices for carrying or having computer-executable instructions or data structures stored thereon. Such tangible computer-readable storage devices may be any available device that may be accessed by a general purpose or special purpose computer, including the functional design of any special purpose processor as described above. By way of example, and not limitation, such tangible computer-readable devices may include RAM, ROM, EEPROM, CD-ROM or other optical disk storage, magnetic disk storage or other magnetic storage devices, or any other device which may be used to carry or store desired program code in the form of computer-executable instructions, data structures, or processor chip design. When information or instructions are provided via a network, or another communications connection (either hardwired, wireless, or combination thereof), to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Figure 5:
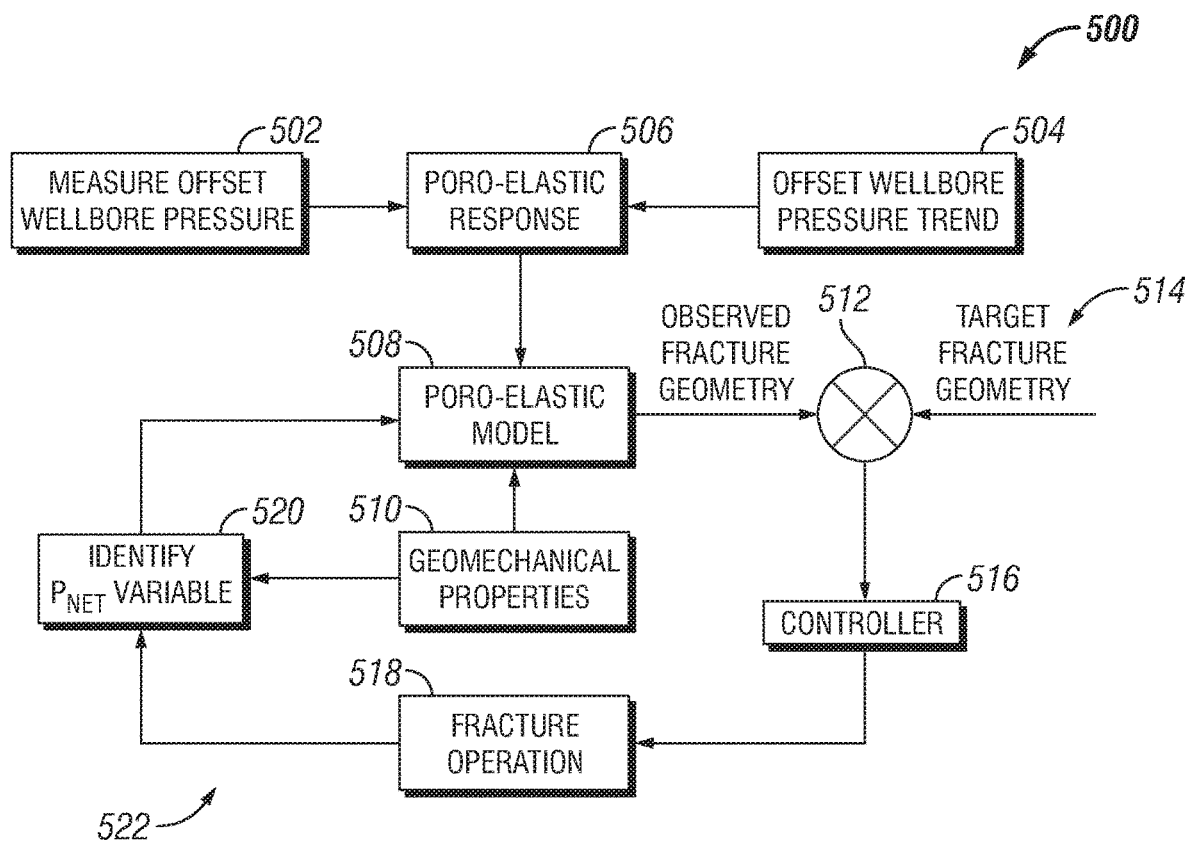
FIG. 5 illustrates a workflow for determining fracture geometry.

In additional examples, methods may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices FIG. 5 illustrates a workflow 500 for controlling fracture geometry of fracture 104 (e.g., referring to FIG. 2) during a fracture operation of a target wellbore 102 (e.g., referring to FIG. 2). Utilizing information handling system 132 (e.g., referring to FIGS. 1, 3, and 4), described in detail above, a user may determine fracture geometry by modeling information in a software program. Currently, determining fracture geometry of fracture 104, created during fracture operations described above, in real time is unreliable and error prone. Workflow 500 utilizes a method, implemented and modeled in software on information handling system 132 to more accurately determine fracture geometry in a target wellbore 102.

Workflow 500 may begin with block 502, which may also be referred to as a "step," in which pressure measurements from an offset wellbore 101 (e.g., referring to FIG. 1), knowledge of the current production field, and databases of acquired information from the construction of offset wellbores 101 may be input into information handling system 132 (e.g., referring to FIG. 4) through communication interface 326 as data (e.g., referring to FIG. 4). This data may be modeled by information handing system 132 and visualized as output through an output device 324 (e.g., referring to FIG. 4) of information handling system 132. The modeling performed utilizes the input data to determine fracture geometry of fractures 104 of target wellbore 102 (e.g., referring to FIG. 1). Referring back to FIG. 2, fracture geometry, specifically length, height, and width, may be controlled within target wellbore 102 utilizing measurements, as input date, from an offset wellbore 101.

Figure 6:
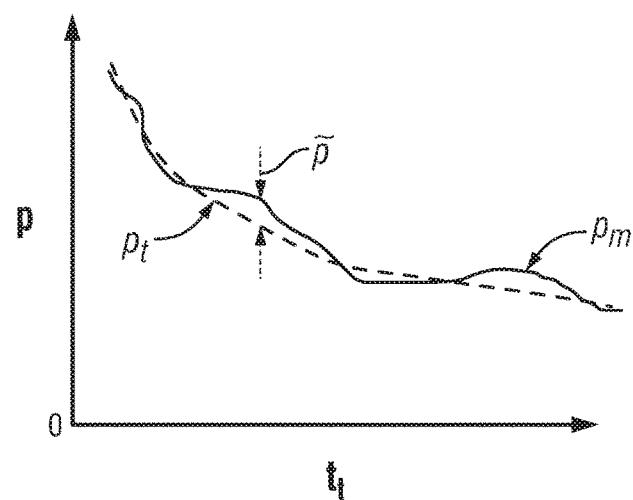
FIG. 6 is a graph of pressure versus time.

In block 502, pressure measurements may be performed by known methods and systems at the surface or within offset wellbore 101 (e.g., referring to FIG. 1) at a specified location as one or more downhole measurements. In examples, the downhole measurements may be at a known location of a fracture in offset wellbore 101. Offset wellbore 101 fracture dimensions, such as fracture geometry, may have been recorded and stored in a database for use by information handling system 132 (e.g., referring to FIG. 4). As discussed below, there may be a plurality of offset wellbores 101 in which measurements may be taken to identify other variables and measurements. The pressure measurements taken in an offset wellbore 101 are measurements of pressure responses within the wellbore. This pressure response is identified as a $p_m$ curve in FIG. 6. FIG. 6 illustrates a pressure vs time graph. As illustrated, pressure, identified as p, is along the y-axis and logs pressure measurements from 0 at the origin of the graph to increasing pressure up the y-axis. Additionally, the X-axis records time, identified at $t_r$, which starts from 0 at the origin of the graph. Time from the origin increases along the x-axis away from the origin. Referring back to FIG. 5, in examples, if the measured pressure is a surface pressure, correction may be needed. Correction may be applied by using hydrostatic pressure to obtain the wellbore pressure, which is also identified as the bottom gauge. Correction is found using the following equation:

Bottom hole pressure=Surface Pressure+Hydrostatic Pressure−friction pressure (1)

Surface pressure is found from standard measurement operations and systems taken at the surface of offset wellbore 101 (e.g., referring to FIG. 1). Hydrostatic pressure is found from standard measurement operations and systems taken within offset wellbore 101. Additionally, friction pressure is found from standard measurement operations and systems taken within offset wellbore 101. However, correction may be simplified if offset wellbore 101 is in a shut-in stage. For example, if offset wellbore 101 is in shut-in stage, then friction pressure is zero for offset wellbore 101. Corrections are not necessary if the condition of offset wellbore 101 does not change during the process of monitoring, as only the difference in pressures is utilized.

In block 504, an offset wellbore pressure trend is determined. The pressure trend may be determined by relating a natural response, a natural pressure response, in offset wellbore 101 (e.g., referring to FIG. 1) in the absence of wellbore operations, for example, when offset wellbore 101 is shut in. After determining a pressure trend, the pressure trend is identified as a $p_t$ curve in FIG. 6. Identification of the pressure trend may also be bound by the type of wellbore operation offset wellbore 101 is undergoing. For example, if offset wellbore 101 was recently fractured then the natural process may follow the typical pressure decline associated with a shut-in stage well. The pressure decline curve may include well-known zones such as pressure-dependent leak-off (PDL), fracture closure, and/or the final leak-off. In determining a pressure trend, known curves of pressure decline in a shut-in offset wellbore 101, identified as type curves, may be fitted to the existing data (for examples past stages from the same pad or the formation) to extract these trends. In another example. if offset wellbore 101 is a producing well, then the history of the pressure serves as the natural response. This history is identified as one or more records of pressure vs time observations in offset wellbore 101, until fracking has started on another wellbore. For this disclosure, offset wellbore 101, which may be a producing well, may be in a shut-in status during fracturing treatment on target wellbore 102 (e.g., referring to FIG. 1). The history of pressure during the shut-in period of "producing" well (or parent well) will serve as natural response.

After identifying the pressure trend in block 504, a poro-elastic trend, identified as $\tilde{p}$ in FIG. 6, is determined in block 506. The poro-elastic tend is a difference between the measured pressure ($p_m$) and the pressure trend ($p_t$) using the Equation below:

$$\tilde{p}=p_m-p_t \quad (2)$$

Referring to FIG. 6, after plotting curves $p_m$ and $p_t$, which may be plotted and modeled by information handling system 132 (e.g., referring to FIGS. 1, 3, and 4), curves $p_m$ and $p_t$ may be analyzed by information handling system 132 to determine poro-elastic trends, which are the difference, both positive and negative, of curve $p_m$ compared to curve $p_t$. Additionally, within FIG. 6, each poro-elastic trend may be time matched using a time stamp. Time matching, which may also be referred to as trend matching, is an operation of identifying a pressure curve before operations have started and identifying which type curve it matches. This is performed by analyzing the curve of pressure vs time, also by knowing the fissure open pressure minimum stress, further discussed below. Once the pressure curve is placed in a type curve region it belongs, the deviation from the type curve is found.

To determine a poro-elastic trend, if offset wellbore 101 (e.g., referring to FIG. 1) is a recently fractured well, then the region among the possible zones (PDL, fracture closure and leak-off) corresponds to the current time is identified. This may be performed by the knowledge of volume of fluid pumped, fissure opening pressure, minimum stress and reservoir pressure, through physics based on data-based models. This is part of a poro-elastic calculations, which may utilize a physics based model that simulates the fracking that has been done on offset wellbore 101, and generates the type curves. Another approach is data based, where observed curves and the parameters of the operation have been collected.

After identifying pro-elastic trends in block 506, a pro-elastic model is created in block 508 with information handling system 132 and further visualized and analyzed by information handling system 132. Fracture dimensions, such as height, length, width, as well as others, are determined from the pro-elastic model with information handling system 132. In examples, the following Equation, which uses for already solved pro-elastic trend $\tilde{p}$, may be used to determine facture geometry, specifically dimensions:

$$\tilde{p}=f(P_{net},v,H,L,\theta,x,y,z) \quad (3)$$

While Equation (3) is utilized to determine fracture geometry, other pro-elastic models may be utilized. In block 510, utilizing Equation (3), geomechanical properties of offset well 101 (e.g., referring to FIG. 1) are found using Poisson's Ratio and are identified as variable v. These geomechanical properties may be obtained by log processing or other databases from the region. The geomechanical properties solved for in block 510 are added to block 508 for creating and visualizing the pro-elastic model. Referring back to block 508, to solve Equation (3), the variables within Equation (3) are found through measurements taken in offset wellbore 101 (e.g., referring to FIG. 1) or solved for. For example, relative co-ordinates (x, y, z) of the observation location, where a pressure sensor is installed in offset wellbore 101 to measure pressure, to fracture are known from well constructions and stage location details. Thus, this leaves four variables in Equation (3) that are still unknown, $P_{net}$, H, L, and θ. If four or more unique offset wellbores 101 are available, then each offset may be utilized to determine a specific variable in real time. For example, if four values of $\tilde{p}$ (i.e., four offset wellbores 101) are available, then four unknowns may be solved by inverting Equation (3) as an optimization problem.

In other examples, additional operations may be performed to reduce the number of measurements needed. For example, fracture orientation (θ) does not vary for a formation as it is primarily determined by the formation principal stress orientation. If this orientation is available from logs of target wellbore 102 or offset wellbore 101 (e.g., referring to FIG. 1) that is in the same formation, then it may be removed from the list of unknowns. The net fracture pressure, identified as variable $P_{net}$, may be estimated using instantaneous shut in pressure (ISIP) and the minimum stress ($\sigma_{min}$). As this data is readily available at the end of each stage, a prediction correlation may be built for the current stage. Net fracture pressure is solved using:

$$P_{net}=ISIP-\sigma_{min} \quad (4)$$

If the region of fracturing has well defined stress confinement, then the fracture height may be estimated apriori. If this knowledge of the height is not available, then a correlation between fracture height and $P_{net}$ may be used, for example in a simple planar fracture model such as a Perkins-Kern-Nordgren (PKN) model and/or the like. Thus, the fracture length would become only the unknown and hence only one measurement would be needed.

In other examples, if fracture orientation (θ) is not known, it may be assumed that fracture orientation (θ) may remain constant. Thus, it may require two observations in the beginning of fracture operations of target wellbore 102 (e.g., referring to FIG. 1) and for the rest of fracture monitoring it may rely on only one observation. For example, two observation means, two offset wellbores 101 (e.g., referring to FIG. 1) where pressure may be measured (i.e. two values for p̃). If providing two observation is impossible, then "two sacrificial stages" may be utilized during processing. Sacrificial stages are defined as a treatment operation during fracture operations of target wellbore 102 (e.g., referring to FIG. 1) in which identical treatment in applied sequentially to two stages, while observing the response from offset wellbore 101. These two measurements then provides the orientation (θ), which may then be used in subsequent calculations. Additionally, when there are more pressure measurements from offset wellbores 101 than unknowns in the problem, an optimization problem may be used to obtain the answer with higher confidence. Solving Equation (3) in block 508 for fracture dimensions, with the found unknowns and solved pro-elastic trend p̃, allows for fracturing operations to be altered, if need.

With continued reference to FIG. 5, observed fracture geometry, the output from block 508 is compared in block 512 to target fracture geometry 514 of fracture 104 (e.g., referring to FIG. 1). Target fracture geometry 514 is determined before fracture operations are performed on target wellbore 102 (e.g., referring to FIG. 1). Target fracture geometry is determined based at least in part on design goals, for example, avoiding well interference, or provide higher complexity within a formation. For examples, target fracture geometry may take into account uniformity of the length over the clusters, length of the fracture, width of the fracture, prevention of interference with another well, and/or the like.

In block 512, if the comparison between target fracture geometry 514 and observed facture geometry is deemed inadequate, then the fracturing operation at target wellbore 102 (e.g., referring to FIG. 1) may be altered. Inadequate is defined as any deviation of the observed fracture geometry from the designed fracture geometry. In examples, correction to the deviation may occur if the deviation is over a set threshold. The threshold is a percentage set by personnel during fracture operations. For example, the threshold may be 1%, 5%, 10%, 15%, 20%, 25%, 30%, 35%, 40%, 45%, 50%, 60%. 70%, 80%, or 90% deviation from designed fracture geometry. For example, during fracture operations growth rate of fracture 104 (e.g., referring to FIG. 1) is 5% above the threshold for target fracture growth rate, and well interference is anticipated. Personnel may alter fracture operations to reduce the percentage the growth rate is above the threshold.

The inadequate finding of the comparison in block 512 is communicated to a controller in block 516. The controller in block 516 may be personnel that are running the fracture operation. Notification may be communicated to the personnel through information handling system 132 (e.g., referring to FIGS. 1, 3, and 4) through visualization, an alert, audible tone, graph, and/or the like. In examples, information handling system 132 may be connected to the fracture equipment utilized to perform the fracture operation on target wellbore 102 (e.g., referring to FIG. 1). This may allow information handling system 132 to operate autonomously, specifically, controlling the fracture equipment. In block 518 fracture operations may be altered. Alteration of fracture operations my include, stopping fracture operations, dropping diverters, manipulating flow rate or proppant rate, manipulating friction reducer concentration, and/or the like. The changes from block 518, fracture operations, and geomechanical properties found in block 510 are utilized to update the variable $P_{net}$, discussed above, in block 520. Output form block 520 is used to update the poro-elastic model in block 508. Updating the poro-elastic model is defined as an update loop 522. Update loop 522 may be performed any number of times to create fracture geometry of a target wellbore during fracture operations that matches target fracture geometry 514. This loop may be controlled by information handling system 132 autonomously or personnel may make decisions based on comparisons performed, and altered to, by information handling system 132. This method and system may include any of the various features of the compositions, methods, and system disclosed herein, including one or more of the following statements.

Statement 1: A method for modeling a fracture geometry may comprise taking one or more pressure measurements from an offset wellbore, identifying a pressure trend of the offset wellbore, comparing the one or more pressure measurements to the pressure trend to identify a poro-elastic trend, creating a poro-elastic model of a target wellbore from the poro-elastic trend, identifying the fracture geometry of a fracture in the target wellbore from at least the poro-elastic trend, and comparing the fracture geometry to a target fracture geometry.

Statement 2. The method of statement 1, wherein the pressure measurement is taken at a surface of offset wellbore.

Statement 3. The method of statement 2, further comprising correcting the pressure measurement with a hydrostatic pressure to identify wellbore pressure.

Statement 4. The method of statements 1 or 2, further comprising identifying the pressure trend from one or more type curves.

Statement 5. The method of statements 1, 2, or 4, further comprising time stamping the poro-elastic trend.

Statement 6. The method of statements 1, 2, 4, or 5, wherein the fracture geometry comprises at least one dimension selected from the group consisting of length, width, and height.

Statement 7. The method of statements 1, 2, or 4-6, further comprising identifying geomechanical properties of a subterranean formation penetrated by the offset wellbore to update the poro-elastic model.

Statement 8. The method of statements 1, 2, or 4-7, wherein the poro-elastic trend is the difference between the one or more pressure measurements and the pressure trend.

Statement 9. The method of statements 1, 2, or 4-8, further comprising performing an update loop to update the poro-elastic model if the fracture geometry is inadequate for the target fracture geometry by contacting a controller.

Statement 10. The method of statement 9, further comprising altering a fracture operation with the controller.

Statement 11. The method of statement 9, further comprising updating a net fracture pressure for the poro-elastic model.

Statement 12. A system configured to model a fracture geometry may comprise a pressure measurement device disposed in an offset wellbore and configured to take one or more pressure measurements in the offset wellbore, one or more pieces of equipment configured for a fracture operation and connected to a target wellbore, and an information handling system connected to the one or more pieces of equipment. The information handling system may be configured to identify a pressure trend of the offset wellbore, compare the pressure measurement to the pressure trend to identify a poro-elastic trend, create a poro-elastic model of the target wellbore from the poro-elastic trend, identify the fracture geometry of a fracture in the target wellbore from the poro-elastic trend, and compare the fracture geometry to a target fracture geometry.

Statement 13. The system of statement 12, wherein the pressure measurement is taken at a surface of offset wellbore.

Statement 14. The system of statement 12 or 13, wherein the information handling system is further configured to correct the one or more pressure measurements using a hydrostatic pressure to identify wellbore pressure.

Statement 15. The system of statements 12-14, wherein the information handling system is further configured to identify the pressure trend from one or more type curves.

Statement 16. The system of statements 12-15, the information handling system is further configured to time stamp the poro-elastic trend.

Statement 17. The system of statements 12-16, wherein the fracture geometry comprises at least one dimension selected from the group consisting of length, width, and height.

Statement 18. The system of statements 12-17, wherein the information handling system is further configured to identify geomechanical properties of a subterranean formation penetrated by the offset wellbore to update the poro-elastic model.

Statement 19. The system of statements 12-18, wherein the poro-elastic trend is the difference between the one or more pressure measurements and the pressure trend.

Statement 20. The system of statements 12-18, wherein the information handling system is further configured to perform an update loop to update the poro-elastic model if the fracture geometry is inadequate for the target fracture geometry by contacting a controller.

The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods may also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only, and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A method for modeling a fracture geometry, comprising:
    taking one or more pressure measurements from an offset wellbore while performing a fracture operation in a target wellbore;
    identifying a pressure trend of the offset wellbore;
    comparing the one or more pressure measurements to the pressure trend to identify a poro-elastic trend;
    creating a poro-elastic model of the target wellbore from the poro-elastic trend;
    identifying the fracture geometry of a fracture in the target wellbore from at least the poro-elastic model; and
    comparing the fracture geometry to a target fracture geometry.

2. The method of claim 1, wherein the pressure measurement is taken at a surface of offset wellbore.

3. The method of claim 2, further comprising correcting the pressure measurement with a hydrostatic pressure to identify wellbore pressure.

4. The method of claim 1, further comprising identifying the pressure trend from one or more type curves.

5. The method of claim 1, further comprising time stamping the poro-elastic trend.

6. The method of claim 1, wherein the fracture geometry comprises at least one dimension selected from the group consisting of length, width, and height.

7. The method of claim 1, further comprising identifying geomechanical properties of a subterranean formation penetrated by the offset wellbore to update the poro-elastic model.

8. The method of claim 1, wherein the poro-elastic trend is the difference between the one or more pressure measurements and the pressure trend.

9. The method of claim 1, further comprising performing an update loop to update the poro-elastic model if the fracture geometry is inadequate for the target fracture geometry by contacting a controller.

10. The method of claim 9, further comprising altering the fracture operation with the controller.

11. The method of claim 9, further comprising updating a net fracture pressure for the poro-elastic model.

12. A system configured to model a fracture geometry, comprising:
   a pressure measurement device disposed in an offset wellbore and configured to take one or more pressure measurements in the offset wellbore while performing a fracture operation on a target wellbore;
   one or more pieces of equipment configured for the fracture operation and connected to the target wellbore;
   an information handling system connected to the one or more pieces of equipment, wherein the information handling system is configured to:
      identify a pressure trend of the offset wellbore;
      compare the pressure measurement to the pressure trend to identify a poro-elastic trend;
      create a poro-elastic model of the target wellbore from the poro-elastic trend;
      identify the fracture geometry of a fracture in the target wellbore from the poro-elastic model; and
      compare the fracture geometry to a target fracture geometry.

13. The system of claim 12, wherein the pressure measurement is taken at a surface of the offset wellbore.

14. The system of claim 12, wherein the information handling system is further configured to correct the one or more pressure measurements using a hydrostatic pressure to identify wellbore pressure.

15. The system of claim 12, wherein the information handling system is further configured to identify the pressure trend from one or more type curves.

16. The system of claim 12, the information handling system is further configured to time stamp the poro-elastic trend.

17. The system of claim 12, wherein the fracture geometry comprises at least one dimension selected from the group consisting of length, width, and height.

18. The system of claim 12, wherein the information handling system is further configured to identify geomechanical properties of a subterranean formation penetrated by the offset wellbore to update the poro-elastic model.

19. The system of claim 12, wherein the poro-elastic trend is the difference between the one or more pressure measurements and the pressure trend.

20. The system of claim 12, wherein the information handling system is further configured to perform an update loop to update the poro-elastic model if the fracture geometry is inadequate for the target fracture geometry by contacting a controller.

* * * * *